United States Patent
Chen et al.

(10) Patent No.: US 11,133,216 B2
(45) Date of Patent: Sep. 28, 2021

(54) INTERCONNECT STRUCTURE

(71) Applicant: International Business Machines Corporation, Armonk, NY (US)

(72) Inventors: Hsueh-Chung Chen, Cohoes, NY (US); Roger A. Quon, Rhinebeck, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 172 days.

(21) Appl. No.: 15/995,768

(22) Filed: Jun. 1, 2018

(65) Prior Publication Data

US 2019/0371656 A1    Dec. 5, 2019

(51) Int. Cl.
| | | |
|---|---|---|
| *H01L 21/768* | (2006.01) | |
| *H01L 21/02* | (2006.01) | |
| *H01L 23/532* | (2006.01) | |
| *H01L 23/522* | (2006.01) | |

(52) U.S. Cl.
CPC .. *H01L 21/76823* (2013.01); *H01L 21/02332* (2013.01); *H01L 21/7684* (2013.01); *H01L 21/76814* (2013.01); *H01L 21/76846* (2013.01); *H01L 21/76871* (2013.01);
(Continued)

(58) Field of Classification Search
CPC ......... H01L 21/02332; H01L 21/76823; H01L 21/76814; H01L 21/7684; H01L 23/53238; H01L 21/76871; H01L 21/76877; H01L 23/5226; H01L 21/76846; H01L 21/76843;
(Continued)

(56) References Cited

U.S. PATENT DOCUMENTS

| | | |
|---|---|---|
| 6,491,978 B1 | 12/2002 | Kalyanam |
| 6,528,180 B1 | 3/2003 | Lee et al. |
| 6,680,538 B2 | 1/2004 | Kim et al. |

(Continued)

FOREIGN PATENT DOCUMENTS

CN    102427040 A    4/2012

OTHER PUBLICATIONS

Anonymous, "Method for Introducing Stacked Barriers for Forming Advanced Copper (Cu) Interconnect Structures", IP.com No. IPCOM000240428D, Jan. 29, 2015, 5 pages.

(Continued)

*Primary Examiner* — Benjamin Tzu-Hung Liu
*Assistant Examiner* — Benjamin T Liu
(74) *Attorney, Agent, or Firm* — Cantor Colburn LLP; L. Jeffrey Kelly (57) ABSTRACT

A nitridation treatment method is provided. The nitridation treatment method includes executing a nitridation treatment with respect to a hydrophobic surface defining an interconnect trench to convert the hydrophobic surface to a hydrophilic surface. The nitridation treatment method further includes depositing a seed layer including a conductive material and manganese on the hydrophilic surface. The nitridation treatment method also includes thermally driving all the manganese out of the seed layer to form a diffusion barrier including manganese at the hydrophilic surface. In addition, the nitridation treatment method includes filling remaining space in the interconnect trench with the conductive material to form an interconnect.

14 Claims, 4 Drawing Sheets

(52) U.S. Cl.
CPC .... *H01L 21/76877* (2013.01); *H01L 23/5226* (2013.01); *H01L 23/53238* (2013.01)

(58) Field of Classification Search
CPC ......... H01L 21/76864; H01L 21/76826; H01L 21/76831
See application file for complete search history.

(56) References Cited

U.S. PATENT DOCUMENTS

| | | | |
|---|---|---|---|
| 6,736,701 | B1 | 5/2004 | Shue et al. |
| 6,783,868 | B2 | 8/2004 | Ciotti et al. |
| 6,910,947 | B2 | 6/2005 | Paik |
| 6,913,938 | B2 | 7/2005 | Shanmugasundram et al. |
| 6,919,636 | B1 | 7/2005 | Ryan |
| 6,936,843 | B2 | 8/2005 | Cui |
| 6,950,716 | B2 | 9/2005 | Ward et al. |
| 6,952,052 | B1 | 10/2005 | Marathe et al. |
| 6,961,626 | B1 | 11/2005 | Paik |
| 6,984,198 | B2 | 1/2006 | Krishnamurthy et al. |
| 6,999,836 | B2 | 2/2006 | Schwarm et al. |
| 7,040,956 | B2 | 5/2006 | Paik |
| 7,069,101 | B1 | 6/2006 | Arackaparambil et al. |
| 7,082,345 | B2 | 7/2006 | Shanmugasundram et al. |
| 7,272,459 | B2 | 9/2007 | Kokotov et al. |
| 7,333,871 | B2 | 2/2008 | Schwarm |
| 7,337,019 | B2 | 2/2008 | Reiss et al. |
| 7,349,753 | B2 | 3/2008 | Paik |
| 7,354,332 | B2 | 4/2008 | Surana et al. |
| 7,888,253 | B2 | 2/2011 | Usui et al. |
| 8,133,813 | B2 | 5/2012 | Koike et al. |
| 8,242,019 | B2 * | 8/2012 | Ishizaka ............ H01L 21/76856 438/686 |
| 8,517,769 | B1 | 8/2013 | Lin et al. |
| 8,653,663 | B2 | 2/2014 | Kao et al. |
| 8,653,664 | B2 | 2/2014 | Liu et al. |
| 2004/0115407 | A1 | 6/2004 | Cohen et al. |
| 2005/0003660 | A1 | 1/2005 | Murakawa et al. |
| 2009/0263965 | A1 | 10/2009 | Gordon et al. |
| 2011/0006430 | A1 | 1/2011 | Jourdan et al. |
| 2013/0292806 | A1 * | 11/2013 | Ma .................... H01L 21/76846 257/632 |
| 2014/0021615 | A1 * | 1/2014 | Ryan ................. H01L 21/02697 257/751 |
| 2014/0161992 | A1 * | 6/2014 | Ishizaka ............ H01L 21/28556 427/576 |
| 2016/0027738 | A1 * | 1/2016 | Murray ............. H01L 21/76897 257/751 |
| 2017/0077037 | A1 * | 3/2017 | Kelly ................ H01L 21/76855 |

OTHER PUBLICATIONS

Jourdan et al., "Evaluation of Metallization Options for Advanced Cu Interconnects Application", ECS Transactions, 34 (1) pp. 515-521 (2011).

Koike et al., "Cu alloy metallization for self-forming barrier process", Proc.2006 IEEE International Interconnect Technology Conference (IITC 20006), pp. 161-163 (2006).

Koike et al., "Self-forming diffusion barrier layer in Cu—Mn alloy metallization", Appl. Phys. Lett. 87, pp. 041911-1 to3 (2005).

Nogami et al., "Through-Cobalt Self Forming Barrier (tCoSFB) for Cu/ULK BEOL: A novel concept for advanced technology nodes", Proc. IEEE IEDM Meeting, pp. 8-1-1 to 4, (2015).

Simon et al., "Electromigration comparison of selective CVD cobalt . . . dual-damascene Cu interconnects", Proc. IEEE IRPS Symp., pp. 3F-4-1 to 6 (2013).

Su et al., "Investigation of Barrier Property of Copper Manganese Alloy on Ruthenium", IEEE Trans. on Dev. and Matts. Reliability, 15(1), pp. 47-53 (2015).

Usui et al., "High performance ultra low-k (k=2.0/keff=2.4)/ Cu . . . technology with self-formed MnSixOy barrier layer for 32 nm-node", Proc. IEEE IITC pp. 216-218 (2006).

Usui et al., "Highly Reliable Copper Dual-Damascene Interconnects With Self-Formed MnSixOy Barrier Layer", IEEE Trans. on Elec. Dev., vol. 53, No. 10, pp. 2492-2498 (2006).

Wilks et al., "Nitridation of organo-silicate glass: A self-limiting process for PVD Ta 1+ x N/Ta barrier formation", Applied Surface Science, 255(23), pp. 9543-9547 (2009).

Watanabe et al., "Self-Formed Barrier Technology using CuMn Alloy Seed for Copper Dual-Damascene Interconnect with porous-SiOC/ porous-PAr Hybrid Dielectric", 2007, IEEE, 3 pages.

* cited by examiner

INTERCONNECT STRUCTURE

BACKGROUND

The present invention generally relates to interconnect structures. More specifically, the present invention relates to an interconnect structure, a nitridation treatment method and a method of forming a self-forming barrier.

Integrated circuits (ICs) often use copper interconnects for electrical interconnections in one or more metallization layers, such as back-end-of-line (BEOL) layers. Since copper is typically a better conductor than aluminium, ICs using copper interconnects can have progressively smaller metallic components and can use less energy than other similar devices. Together, these effects lead to higher-performance processors.

SUMMARY

Embodiments of the present invention are directed to a nitridation treatment method. A non-limiting example of the nitridation treatment method includes executing a nitridation treatment with respect to a hydrophobic surface defining an interconnect trench to convert the hydrophobic surface to a hydrophilic surface. The non-limiting example of the nitridation treatment method further includes depositing a seed layer including a conductive material and manganese on the hydrophilic surface. The non-limiting example of the nitridation treatment method also includes thermally driving the manganese out of the seed layer to form a diffusion barrier including manganese at the hydrophilic surface. In addition, the non-limiting example of the nitridation treatment method includes filling remaining space in the interconnect trench with the conductive material to form an interconnect.

Embodiments of the present invention are directed to a method of forming a self-forming barrier. A non-limiting example of the method includes defining an interconnect trench in an inter-metal dielectric (IMD) substrate with a silicon-carbon-oxygen-hydrogen (Si—C—O—H) surface. The Si—C—O—H surface is treated to form a silicon-nitrogen-oxygen (Si—N—O) surface. The method further includes depositing a seed layer comprising a conductive material and manganese on the Si—N—O surface. All of the manganese is driven out of the seed layer and through the Si—N—O surface to form a diffusion barrier that includes manganese between the Si—N—O surface and the IMD substrate. The method further includes filling remaining space in the interconnect trench with the conductive material to form an interconnect.

Embodiments of the invention are directed to an interconnect structure. A non-limiting example of the interconnect structure includes an inter-metal dielectric substrate defining an interconnect trench. The non-limiting example of the interconnect structure further includes an interconnect that includes conductive material disposed within the interconnect trench. The non-limiting example of the interconnect structure also includes a diffusion barrier. The diffusion barrier includes only dielectric material disposed between an exterior surface of the interconnect and interior facing surfaces of the interconnect trench.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device, integrated circuit (IC) and solar cell fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices, semiconductor-based ICs and solar cells are well known and so, in the interest of brevity, many conventional steps will only be mentioned briefly herein or will be omitted entirely without providing the well-known process details.

Turning now to an overview of technologies that are more specifically relevant to aspects of the invention, copper interconnect structures are often used in various types of ICs. As IC components continue to decrease in size and approach the 7 nanometer (nm) scale and beyond, the performance of the copper interconnect structures become important and efforts to improve performance have been undertaken. Such efforts have involved the use of a tantalum nitride liner, which adheres to interlayer dielectric (ILD), and a cobalt liner and a cobalt cap to line and cap copper interconnects. While the cobalt liner prevents some copper diffusion and the cobalt cap serves to improve electromagnetic performance of the copper interconnect, the tantalum nitride liner does not form a reliable interface with the ILD and does not provide for a desired level of copper diffusion prevention. The reduced reliability can be addressed by nitridizing the ILD so that the tantalum nitride is deposited on a nitridized surface. This improves adhesion but does not improve copper diffusion prevention. Thus, pure copper has been replaced with copper that is impregnated with manganese which can be thermally driven out of the copper to create a self-forming barrier that does provide for improved copper diffusion prevention.

A remaining issue with copper interconnects is that they often exhibit an increase resistance that negatively impacts performance. A reduction of copper interconnect resistance is, therefore, a critical issue for recent technology development. One promising approach for doing so is to increase a copper volume fraction in a copper interconnect by eliminating or reducing physical liner thicknesses by way of through-barrier manganese silicon oxide ($MnSiO_3$) formation. Current integration schemes for forming the $MnSiO_3$ barrier layer has many drawbacks, however, including the diffusion of manganese back into the copper interconnects Turning now to an overview of the aspects of the invention, one or more embodiments of the invention address the above-described shortcomings of the prior art by maximize a copper volume fraction critical for 7 nm scale and beyond technology nodes.

The above-described aspects of the invention address the shortcomings of the prior art by eliminating conventional tantalum nitride diffusion barriers to maximize copper volume fractions for performance enhancement, forming a manganese silicon oxide ($MnSiO_3$) diffusion barrier with or without silicon nitride oxygen (SiNO) and directing cobalt bonding on a nitridized dielectric surface to stabilize the copper interconnect structures.

Figure 1:
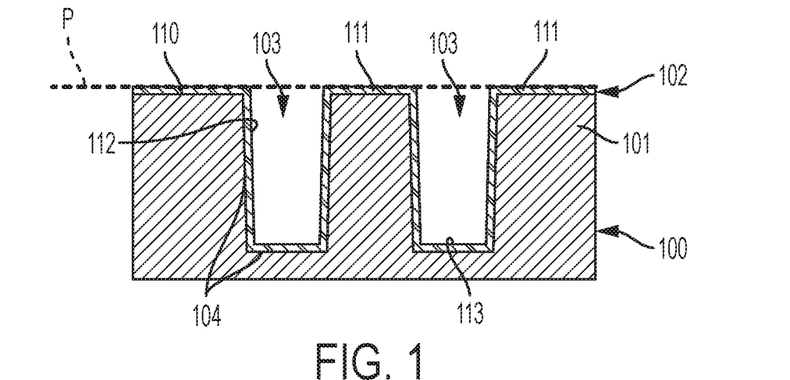
FIG. 1 depicts a side view of an inter-metal dielectric formed to define interconnect trenches with a surface that has been subject to a nitridation treatment in accordance with embodiments.

Turning now to a more detailed description of aspects of the present invention, FIG. 1 depicts a side view of an inter-metal dielectric (IMD) 100. As shown in FIG. 1, the IMD 100 has an IMD body 101 with an uppermost surface 102 that defines a plane P. The IMD body 101 is formed to define interconnect trenches 103 that extend into the IMD body 101 from the plane P of the uppermost surface 102. The interconnect trenches 103 have upward and lateral interior facing surfaces 104. The uppermost surface 102 and the upward and lateral interior facing surfaces 104 of the interconnect trenches 103 are illustrated as having been subject to a nitridation treatment such that an Si—N—O surface or a dielectric layer 110 (hereinafter referred to as "dielectric layer 110") extends over the uppermost surface 102 and the upward and lateral interior facing surfaces 104 of the interconnect trenches 103 such that the dielectric layer 110 includes uppermost portions 111, trench sidewall portions 112 and trench bottom portions 113. The dielectric layer 110 can include or be formed of silicon, nitrogen and oxygen and can be provided as a silicon nitrogen oxygen (SiNO) layer.

Figure 2:
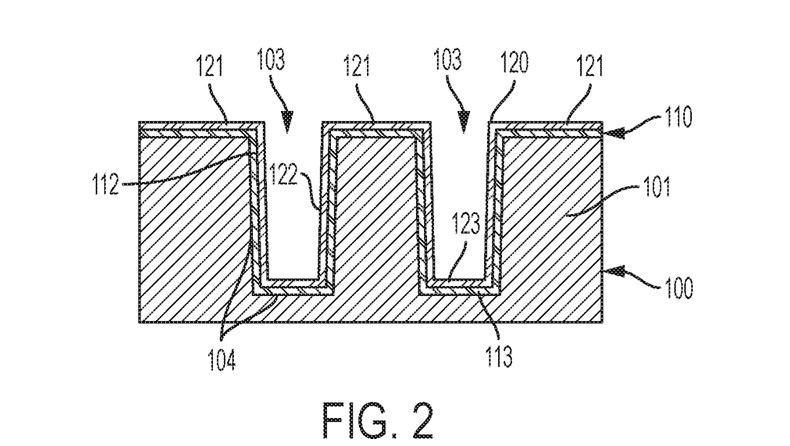
FIG. 2 depicts a side view of a deposition of a wetting layer on the surface subjected to the nitridation treatment of FIG. 1 in accordance with embodiments.

FIG. 2 depicts a side view of a deposition of a wetting layer 120 on the dielectric layer 110. The wetting layer 120 can include uppermost portions 121, trench sidewall portions 122 and trench bottom portions 123. The uppermost portions 121 lie over the uppermost portions 111 of the dielectric layer 110. The trench sidewall portions 122 lie over the trench sidewall portions 112 of the dielectric layer 110. The trench bottom portions 123 lie over the trench bottom portions 113 of the dielectric layer 110. The wetting layer 120 can include or be formed of at least one of cobalt, ruthenium, iridium and rhodium and can be deposited by any suitable depositional process including, but not limited to, chemical vapor deposition (CVD).

Figure 3:
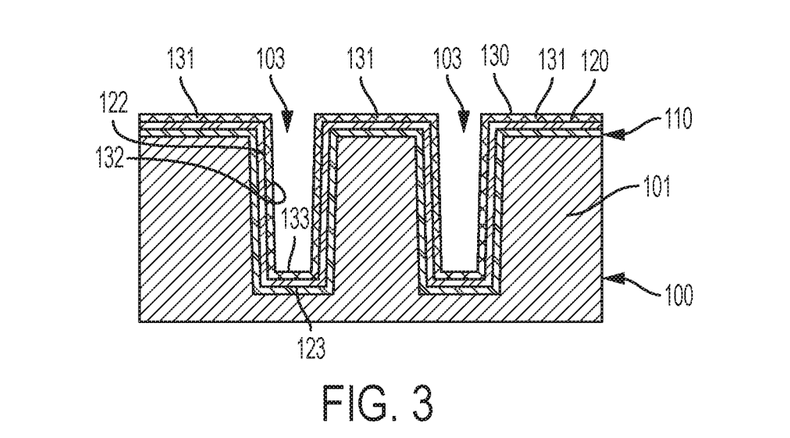
FIG. 3 depicts a side view of a deposition of a seed layer on the wetting layer of FIG. 2 in accordance with embodiments.

FIG. 3 depicts a side view of a deposition of a seed layer 130 on the wetting layer 120 of FIG. 2. The seed layer 130 can include uppermost portions 131, trench sidewall portions 132 and trench bottom portions 133. The uppermost portions 131 lie over the uppermost portions 121 of the wetting layer 120. The trench sidewall portions 132 lie over the trench sidewall portions 122 of the wetting layer 120. The trench bottom portions 133 lie over the trench bottom portions 123 of the wetting layer 120. The seed layer 130 can include or be formed of copper and manganese and can be provided as a copper manganese (CuMn) layer. The deposition of the seed layer 130 can be accomplished by any suitable depositional process.

It is to be understood that the deposition of the wetting layer 120 is optional and that the seed layer 130 could be deposited directly onto the dielectric layer 110. The descriptions provided herein relate to the cases where the wetting layer 120 is formed, however, for purposes of clarity and brevity.

Figure 4:
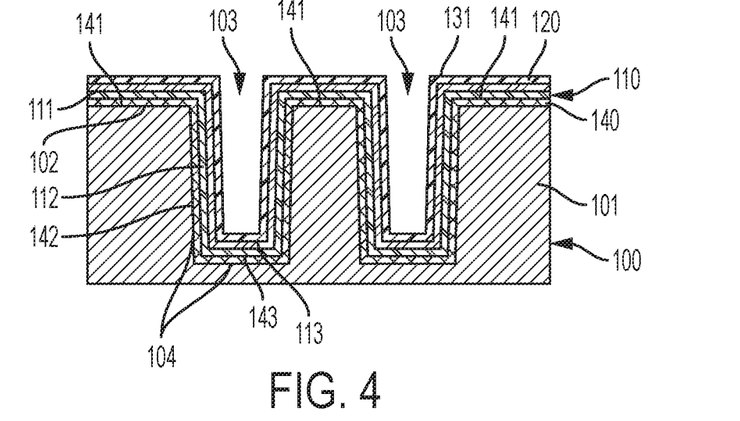
FIG. 4 depicts a side view of a formation of a dielectric self-forming barrier layer due to a thermal process applied to the seed layer of FIG. 3 in accordance with embodiments.

FIG. 4 depicts a side view of a formation of a dielectric self-forming diffusion barrier layer 140. The formation of the dielectric self-forming diffusion barrier layer 140 is due to a thermal process which is applied to the seed layer 130 of FIG. 3 and causes all the manganese in the seed layer 130 to diffuse through the wetting layer 120 and the dielectric layer 110. The dielectric self-forming diffusion barrier layer 140 thus includes uppermost portions 141, trench sidewall portions 142 and trench bottom portions 143. The uppermost portions 141 lie between the uppermost surface 102 of the IMD body 101 and the uppermost portions 111 of the dielectric layer 110. The trench sidewall portions 142 and the trench bottom portions 143 lie between the upward and lateral interior facing surfaces 104 of the interconnect trenches 103 and the trench sidewall and bottom portions 112 and 113 of the dielectric layer 110.

The dielectric self-forming diffusion barrier layer 140 includes or is formed of manganese, silicon and oxygen and can be provided as a manganese silicon oxygen ($MnSiO_3$) layer. In some cases, the dielectric self-forming diffusion barrier layer 140 forms a two-layer barrier layer with the dielectric layer 110 such that the resulting two-layer diffusion barrier layer effectively includes nitrogen as well.

In accordance with embodiments, the dielectric self-forming diffusion barrier layer 140 consists only of manganese, silicon and oxygen or of manganese, silicon, nitrogen and oxygen. That is, the dielectric self-forming diffusion barrier layer 140 does not contain and is absent of tantalum, titanium, tungsten or any other conventional diffusion barrier layer materials.

Figure 5:
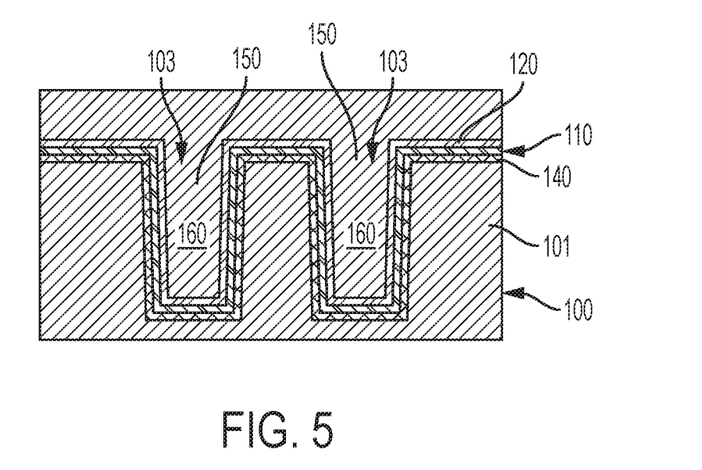
FIG. 5 depicts a side view of a conductive material having been filled into the remaining spaces of the interconnect trenches of FIGS. 1-4 in accordance with embodiments.

FIG. 5 depicts a side view of a conductive material 150 having been filled into the remaining spaces of the interconnect trenches 103. The conductive material 150 can include copper or any other suitable conductive material and forms interconnects 160 within the remaining spaces of the interconnect trenches 103.

Figure 6:
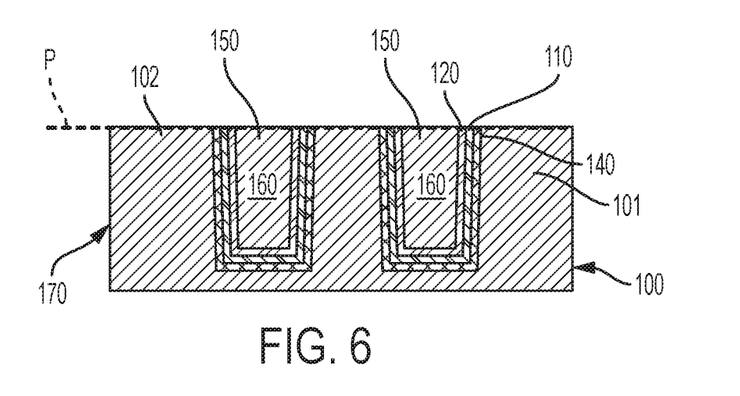
FIG. 6 depicts a side view of an uncapped interconnect structure following a planarization process applied to at least the conductive material of FIG. 5.

FIG. 6 depicts a side view of an uncapped interconnect structure 170 following a planarization process applied to at least the conductive material 150 of FIG. 5. In particular, the planarization process can be conducted as a chemical mechanical polishing (CMP) or another suitable process and results in the interconnects 160, terminal edges of the wetting layer 120, terminal edges of the dielectric layer 110 and terminal edges of the dielectric self-forming diffusion barrier layer 140 being coplanar with the uppermost surface 102 of the IMD body 101.

In accordance with embodiments, the plane P of the uppermost surface 102 may be at a same level or lowered prior to and following the planarization process depending upon a timing of when the planarization process is ceased.

Figure 7:
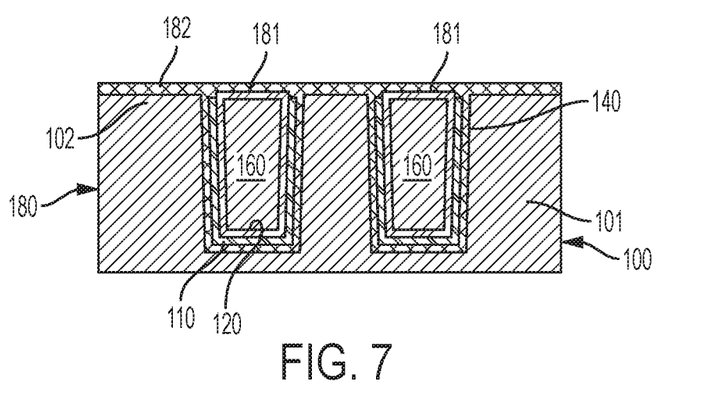
FIG. 7 depicts a side view of an interconnect structure in accordance with embodiments.

FIG. 7 depicts a side view of an interconnect structure 180 once the uncapped interconnect structure 170 of FIG. 6 is capped. As shown in FIG. 7, the interconnect structure 180 includes first cap elements 181 and a second cap element 182. The first cap elements 181 cover exposed surfaces of the interconnects 160. The first cap elements 181 can include or be formed of wetting layer material, such as cobalt, and can result in the interconnects 160 being entirely wrapped or encased in wetting layer material (e.g., cobalt). The second cap element 182 can include or be formed of suitable dielectric material and extends over the first cap elements 181, the terminal edges of the dielectric layer 110 and the uppermost surface 102 of the IMD body 101.

Figure 8:
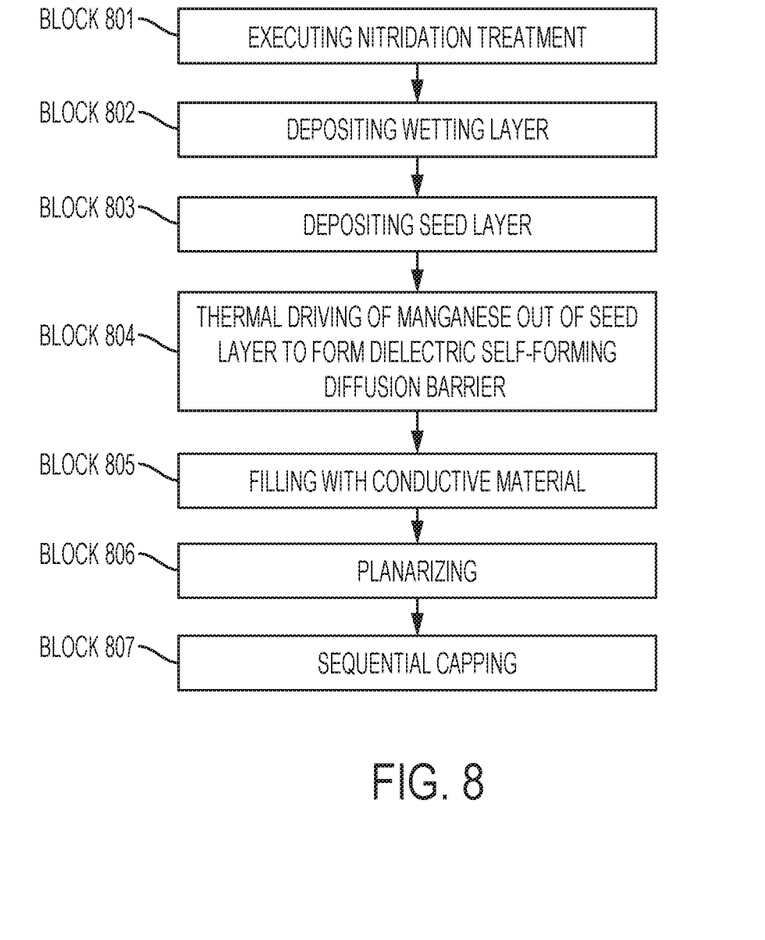
FIG. 8 is a flow diagram illustrating a nitridation treatment method for an interconnect structure in accordance with embodiments.

With reference to FIG. 8, a nitridation treatment method for an interconnect structure is provided. The nitridation treatment method includes executing a nitridation treatment with respect to a hydrophobic surface defining interconnect trenches to convert the hydrophobic surface to a hydrophilic surface (block 801). The nitridation treatment can be executed, for example, as a formation of a nitride layer on an IMD surface as described above. The nitridation treatment method can further include depositing a seed layer, which includes a conductive material and manganese, on the hydrophilic surface (block 802). The nitridation treatment method can optionally include depositing a wetting layer, which includes at least one of cobalt, ruthenium, iridium and rhodium (block 803), prior to the depositing of the seed layer of block 802. The nitridation treatment method can also include thermally driving the manganese out of the seed layer to form a dielectric self-forming diffusion barrier layer, as described above, which includes manganese but does not include tantalum, titanium, tungsten or any other conventional diffusion barrier layer materials, at the hydrophilic surface (block 804). Once the dielectric self-forming diffusion barrier layer is formed, the nitridation treatment method includes a filling of remaining spaces in the interconnect trenches with the conductive material to form interconnects (block 805). At this point, the nitridation treatment method can further include planarizing the interconnects, the dielectric self-forming diffusion barrier layer and the hydrophilic surface (block 806) and a sequential capping of the interconnects with a wetting layer material and a dielectric material (block 807).

Figure 9:
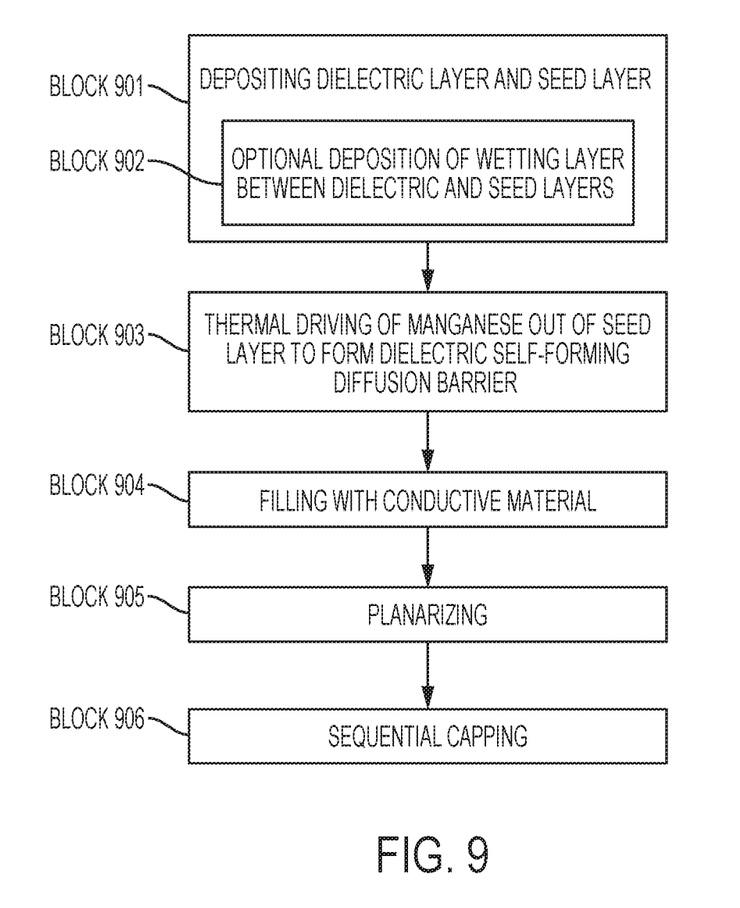
FIG. 9 is a flow diagram illustrating a method of forming a self-forming barrier for an interconnect structure in accordance with embodiments.

With reference to FIG. 9, a method of forming a dielectric self-forming diffusion barrier layer for an interconnect structure is provided. The method includes depositing a dielectric layer and a seed layer, which includes a conductive material and manganese, in sequence on an inter-metal dielectric (IMD) substrate defining interconnect trenches (block 901) The method can also optionally include a deposition of a wetting layer between the dielectric layer and the seed layer (block 902). The method further includes thermally driving the manganese out of the seed layer and through the dielectric layer to form a dielectric self-forming diffusion barrier layer, which includes manganese but does not include tantalum, titanium, tungsten or any other conventional diffusion barrier layer materials, between the dielectric layer and the IMD substrate (block 903). In addition, the method includes filling remaining spaces in the interconnect trenches with the conductive material to form interconnects (block 904). Once the interconnects are formed, the method also includes planarizing the interconnects, the dielectric layer, the diffusion barrier and the IMD substrate (block 905) and sequentially capping the interconnect with a wetting layer material and a dielectric material (block 906).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to
the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but, are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A nitridation treatment method, comprising:
   executing a nitridation treatment with respect to a hydrophobic layer defining an interconnect trench to convert the hydrophobic layer to a hydrophilic layer, which has a thickness between first and second sides thereof;
   depositing a wetting layer on the first side of the hydrophilic layer;
   depositing a seed layer comprising a conductive material and manganese on the wetting layer deposited on the first side of the hydrophilic layer;
   thermally driving the manganese out of the seed layer and through the wetting layer and the hydrophilic layer to form a diffusion barrier comprising manganese at the second side of the hydrophilic layer, which is opposite the first side of the hydrophilic layer; and
   filling remaining space in the interconnect trench with the conductive material to form an interconnect.

2. The nitridation treatment method according to claim 1, wherein the hydrophobic layer comprises an inter-metal dielectric (IMD) substrate.

3. The nitridation treatment method according to claim 2, wherein the executing of the nitridation treatment comprises forming a nitride layer on the IMD substrate.

4. The nitridation treatment method according to claim 1, wherein the wetting layer comprises iridium.

5. The method according to claim 4, further comprising:
   planarizing the interconnect, the diffusion barrier and the hydrophilic layer; and
   capping the interconnect with iridium and a dielectric material in sequence.

6. The nitridation treatment method according to claim 1, wherein the diffusion barrier consists only of manganese, silicon and oxygen.

7. The nitridation treatment method according to claim 1, wherein the diffusion barrier consists only of manganese, silicon, nitrogen and oxygen.

8. A method of forming a self-forming barrier, the method comprising:
   defining an interconnect trench in an inter-metal dielectric (IMD) substrate with a silicon-carbon-oxygen-hydrogen (Si—C—O—H) surface;
   treating the Si—C—O—H surface to form a silicon-nitrogen-oxygen (Si—N—O) layer with a thickness between first and second sides thereof;
   depositing a wetting layer on the first side of the Si—N—O layer;
   depositing a seed layer comprising a conductive material and manganese on the wetting layer deposited on the first side of the Si—N—O layer;
   thermally driving all the manganese out of the seed layer and through the wetting layer and the Si—N—O layer to form a diffusion barrier comprising manganese between the second side of the Si—N—O layer, which is opposite the first side of the SI—N—O layer, and the IMD substrate; and
   filling remaining space in the interconnect trench with the conductive material to form an interconnect.

9. The method according to claim 8, wherein the wetting layer comprises iridium.

10. The method according to claim 8, wherein the diffusion barrier consists only of manganese, silicon and oxygen.

11. The method according to claim 8, wherein the diffusion barrier consists only of manganese, silicon, nitrogen and oxygen.

12. The method according to claim 8, further comprising:
    planarizing the interconnect, the Si—N—O layer, the diffusion barrier and the IMD substrate; and
    capping the interconnect with iridium and a dielectric material in sequence.

13. The method according to claim 12, wherein:
    the IMD substrate comprises a body with an uppermost IMD surface and the interconnect trench extends into the body from a plane of the uppermost IMD surface, and
    the planarizing results in the interconnect, the Si—N—O layer and the diffusion barrier having respective uppermost surfaces coplanar with the uppermost IMD surface.

14. A nitridation treatment method, comprising:
    executing a nitridation treatment with respect to a hydrophobic layer defining an interconnect trench to convert the hydrophobic layer to a hydrophilic layer, which has a thickness between first and second sides thereof;
    depositing a seed layer comprising a conductive material and manganese on the hydrophilic layer;
    thermally driving the manganese out of the seed layer and through a wetting layer interposed between the seed layer and the hydrophilic layer and through the hydrophilic layer to form a diffusion barrier consisting of manganese, silicon, nitrogen and oxygen; and
    filling remaining space in the interconnect trench with the conductive material to form an interconnect.

* * * * *